US00RE36469E

United States Patent [19]

Wood et al.

[11] E Patent Number: Re. 36,469

[45] Reissued Date of Patent: Dec. 28, 1999

[54] PACKAGING FOR SEMICONDUCTOR LOGIC DEVICES

[75] Inventors: Alan G. Wood; Tim J. Corbett, both of Boise, Id.

[73] Assignee: Micron Technology, Inc., Boise, Id.

[21] Appl. No.: 08/534,177

[22] Filed: Sep. 26, 1995

Related U.S. Patent Documents

Reissue of:

[64] Patent No.: 5,138,434
Issued: Aug. 11, 1992
Appl. No.: 07/644,146
Filed: Jan. 22, 1991

U.S. Applications:

[63] Continuation-in-part of application No. 07/311,728, Feb. 15, 1989, Pat. No. 4,992,850, which is a continuation of application No. 07/252,606, Sep. 30, 1988, Pat. No. 4,899,107.

[51] Int. Cl.[6] ..... H01L 23/48

[52] U.S. Cl. ..... 257/685; 257/723; 257/692

[58] Field of Search ..... 257/666, 693, 257/730, 684, 203, 204, 209, 685, 702, 723, 725, 692

[56] References Cited

U.S. PATENT DOCUMENTS

| | | | |
|---|---|---|---|
| 4,855,809 | 8/1989 | Malhi et al. | 357/71 |
| 4,899,107 | 2/1990 | Corbett et al. | 324/158 F |
| 4,922,378 | 5/1990 | Malhi et al. | 357/81 |
| 4,949,163 | 8/1990 | Sudo et al. | 357/71 |
| 4,967,262 | 10/1990 | Furnsworth | 361/400 |
| 4,975,763 | 12/1990 | Baudouin et al. | 357/74 |
| 5,020,999 | 6/1991 | DeWitt et al. | 395/800 |

*Primary Examiner*—Peter Toby Brown
*Assistant Examiner*—Roy Potter
*Attorney, Agent, or Firm*—Fletcher, Yoder & Van Someren

[57] ABSTRACT

A logic module design is disclosed which incorporates an unencapsulated wafer section or sections. The disclosed module is an improvement over previous designs in that it is less expensive and easier to manufacture due to the reduced number of components and the complexity of the components, is faster and consumes less power because of its shorter trace lengths and smaller size, and is more reliable as a result of its greatly reduced number of interconnects.

13 Claims, 7 Drawing Sheets

PACKAGING FOR SEMICONDUCTOR LOGIC DEVICES

Matter enclosed in heavy brackets [ ] appears in the original patent but forms no part of this reissue specification; matter printed in italics indicates the additions made by reissue.

*This is a continuation-in-part application of U.S. application Ser. No. 07/311,728 filed Feb. 15, 1989, issued Feb. 12, 1991 as U.S. Pat. No. 4,992,850; which is a continuing application of U.S. application Ser. No. 07/252,606, filed Sep. 30, 1988, issued Feb. 6, 1990 as U.S. Pat No. 4,899, 107.*

FIELD OF THE INVENTION

This invention relates to logic modules for computers. More specifically, it describes an improved design for packaging memory die or other logic die for a computer or other electronic device. Package types comprising the invention could include a single in-line memory module (SIMM), a small outline "J" lead (SOJ) package, a "gull wing" package, a thin small outline package (TSOP), single in-line package (SIP), or a fine pitch package memory.

BACKGROUND OF THE INVENTION

Memory for computers has evolved continually, both in form and density, since computers have become a consumer electronic product. The personal computer market started about the time that the 16 kilobit (K) dynamic random access memory (DRAM) was the largest selling memory chip. Computers at that time were sold usually with 32 16K chips for 64 kilobytes (KLB) of memory, which was soldered to the computer's motherboard. There was not usually much of a path for adding more memory to the motherboard. There were no provisions for taking out the soldered memory when the next generation chip, the 64K, was developed, as the prevailing thought in the industry was that the average computer user would not require more than 64 KB of memory.

As the 64K DRAM became the chip of choice for computer manufacturers, it was common to add several 64K DRAMs. Computers often were populated with 16 DRAMs for 128 KB of memory, or 32 DRAMs for 256 KB of memory. This memory was also soldered in, and there was no way to add more memory to the motherboard of the computer, as, again, few thought that computer users would need more than 256 KB of memory. When it became necessary to have more memory, computer users were forced to purchase memory expansion boards which fit into a slot in the computer. These expansion boards were expensive since, in addition to purchasing the memory, users had to pay for other logic components, connectors, sockets, and a printed circuit board (PCB) so the slot memory would function. This slot memory was not only more expensive than motherboard memory, it was slower because it used a bank switching method of memory access rather than being accessed directly by the central processing unit (CPU), as memory on the motherboard is accessed. In addition, the board memory often used the same port addresses as other add-ons such as modem cards and graphics cards. This resulted in multiple types of boards answering calls to the port by the computer, thereby rendering the two boards incompatible and causing the computer to operate unreliably.

The problems caused by soldering memory to the motherboard lead to the development of more flexible ways to add memory to computers so that the needs of different types of computer users could be met. The SIMM was developed to fulfill this need. SIMMs are not soldered to the computer's motherboard, but are inserted into a slot on the motherboard. A single SIMM can hold several DRAMs and often comes with 256 KB of memory. Several slots are usually available on the motherboard so computer users can buy additional memory as they need it. To further enhance the flexibility, some computers have provisions for replacing 256 KB SIMMs with one megabyte (MB) SIMMs, even though when the SIMMs first came out, 1 MB SIMMs were not available.

In addition to its ease of installation, the SIMM also provides a means for packing a large amount of memory into a relatively small area of the computer, since the RAMs on a SIMM are inserted vertically into the computer. RAM manufacturers also profit from the SIMM style of packaging, since it adds more value to the RAMs than it costs to produce. Due to its flexibility and ease of installation, the SIMM has become the standard for personal computer memory in the industry. This form of packaging memory has gone from a means for packaging DRAMs, to also include read-only memory (ROM) and static random access memory (SRAM). While the SIMM has many advantages for the computer user, it requires several manufacturing process operations. A typical 1 MB SIMM has nine 1-megabit (Meg) DRAMs and nine decoupling capacitors, which serve to make the power to the DRAMs more uniform. With 20 pins per DRAM, and two pins to each of the capacitors, there are 198 solder points required to connect the components to the PCB. There are also approximately 20 die to wire connections (typically aluminum to gold wire bonds) and 20 wire to leadframe connections (typically gold wire to gold- or silver-plated lead frame) required for each 1 Meg DRAM to connect the silicon die to the leads of the DRAM package, thereby making a minimum of 558 solder and wire bond connections on a typical 1 MB SIMM comprising nine 1 Meg DRAMs. Additionally, there are some double bonds required for $V_{CC}$ and $V_{SS}$, as well as connections for grounding the substrate.

With the number of solder and wire bond connections on the typical SIMM, it becomes imperative to have an extremely low connection failure rate. Given the number of connections on the average SIMM, a solder joint/wire bond failure rate of just 0.001 percent means that over 50 percent of SIMMs would fail due to a poor solder joint. Making a reliable connection between two surfaces by soldering varies with many factors. Temperature of the solder, temperature of the surfaces to be joined, residue or oxidation on the surfaces that are to be joined (intermetallic compounds or IMC), contaminated solder, and other factors all affect the success of joining two surfaces by soldering.

Solder joints can be inadvertently broken before the SIMM is shipped, for example due to assembly stresses. While those failures occurring during assembly will most often be caught during a functional test before the product is shipped, they cause expensive rework and scrap. Even if a product passes the most rigorous functional testing, it can fail in the field because of a poor solder connection. Shipping itself stresses the part, and the stress that a customer induces on the SIMM while installing it in the computer can cause a poor but functional solder joint to fail. Sometimes a part will operate at room temperature, but will fail at the elevated temperatures found inside the cabinet of a computer. This failure is sometimes due to a wire bond which makes adequate contact at room temperature, but, at elevated temperatures, lifts up off the contact due to a difference of thermal expansion between the two adjoining surfaces.

The electrical characteristics of a SIMM can also be a concern. The nine 20-pin DRAMs and the nine decoupling capacitors on a typical 1 MB SIMM require many traces, the actual number depending on the PCB layout. In any case, the large number of traces on a standard sized PCB requires minimal spacing between the traces. As the output drivers within the DRAMs create intermittent current flow on associated conductive traces, the traces behave as inducters, creating voltage surges which have the potential for creating logic errors. With the addition of radio frequency and electromagnetic interferences occurring within the cabinet of the average personal computer, the myriad of potentially logic-damaging transient voltages is compounded. The relatively long traces that connect the DRAM with the edge connector pins on the PCB also slow the memory access times significantly.

A SIMM has an edge connector on the PCB which has several contact pads that are inserted into a socket in a computer, thereby allowing the transfer of data between the module and the computer. This type of connection is just one of many commonly used on memory and logic modules. Single in-line package (SIP) memory modules are similar to SIMMs, but they have metal leads soldered to the edge connectors on the PCB. The leads are either soldered to the computer's motherboard, or inserted into a socket on the motherboard.

SUMMARY OF THE INVENTION

An object of this invention is to provide a logic module design which is smaller than previous modules, thereby requiring less space in devices into which it is installed.

Another object of this invention is to provide a logic module which is more reliable than present designs of modules by requiring fewer solder and wire bond connections.

A third object of this invention is to provide a logic module which is easier to assemble by virtue of its decreased number of components. This reduced number of components and ease of assembly also serves to decrease the costs involved with producing the module while providing an equal amount of memory or other logic.

Finally, it is another object of this invention to provide a logic module with better operating performance than previous logic module designs. This is accomplished by reducing the length of traces the signal must travel though thereby reducing the propagation delay of the signal.

These objects of the present invention are attained by manufacturing a die with means for allowing input/output (I/O) pads to the electronic device into which the module will be installed as part of the die itself. This extra circuitry would effectively perform the electrical function of a PCB (printed circuit board), thereby allowing connection from the I/O pads to the electronic device into which the invention is installed. This extra circuitry is accomplished either by laying down metal layers on top of the die as additional steps in the fabrication process of the die, or by using a flex circuit with tape automated bonding (TAB) techniques on a regular production die. This would provide a dense module which is extremely small compared to previous designs.

In the instance of a memory array, several unsingulated production die can be electrically connected, allowing for a module which performs as a SIMM, but would be much smaller in size and would be manufactured without a PCB. Also, several singulated die could be used, but would require a structure, a "die mount," to support the die which would not be required on an inventive embodiment comprising a single wafer section.

Various elements of possible embodiments are described below.

A die mount is an optional element. The die mount would be used in embodiments incorporating multiple wafer sections, but could also be used in single wafer section designs. The die mount serves to support the die and to draw heat away from the operating die. This mount can be constructed of a metal such as aluminum, or a thermally conductive nonmetal material. The material comprising the die mount is chosen for its ability to provide a solid mount, to act as a heat sink to draw the heat away from the die, and its manufacturability. The shape of the die mount is designed for added surface area to enhance its effectiveness as a heat sink for the die. Maximizing the surface area of the mount should therefore be a consideration during the design of the mount. The die mount can be inexpensively manufactured since most shapes appropriate for the mount lend themselves well to an extruded manufacturing process.

The die used in the invention can take several forms:

1) The invention can comprise a single integrated die containing all logic required for the module and fabricated specifically for use as an element of the invention (i.e. an integrated die). Some previous memory module designs incorporate up to nine die, with each die individually packaged in DRAM form and soldered to a PCB. An integrated die for use as a memory module would have memory storage cells, supporting circuitry, and I/O pads for connection to the electronic device into which the invention will be installed. The I/O pads can be manufactured into the die in the form of additional metal layers on the top of the die, or as a flex circuit coupled with die attach locations (bond pads) on the die, said flex circuit having multiple metal layers comprising traces and forming I/O pads for the electronic device. The metal layers or flex circuit would provide the same electrical functionality as a PCB in a typical memory module design.

In embodiments comprising additional metal layers fabricated on top of the die and forming I/O pads, there would be only one or two connection points with the electronic device into which the invention is installed (depending on whether the module is soldered or socketed onto the electronic device), which is an improvement over previous designs. Previous designs of memory modules have several connections in the form of traces between the die and the I/O lead. There are connections between the die pad and the component lead, between the component package lead and a solder pad on the module PCB, and between the edge connector pin on the PCB and the electronic device. The present invention reduces these and incorporates some of them on the silicon, thereby making the steps much more automated.

2) The die can also comprise a single piece of substrate using a number of die which are not fabricated specifically for the inventive module. In an inventive module designed as memory, for instance, a single wafer section could comprise two or more adjacent RAM die which have not been singulated (i.e. have not been separated from each other) by a die saw. These die are thereby considered unsingulated. The unsingulated die would be handled as a single component, thereby reducing the complexity of the assembly process. Using a plurality of die insures maximum use of existing design and process equipment as is known to the manufacturer and is well established in the industry.

A disadvantage to this type of die would be that it requires a test to find two or more adjacent functional die on the wafer. However, depending on the allowable size of the module, it is possible to have a combination of nonfunctional and functional die, but not use the nonfunctional die. In another case, a natural redundancy exists by using logic devices with multiple data outs DQ's) as, for example, three ×4 DRAMs and employing the best 9 out of 12 DQ's. An inventive module using ×4 DRAMs could use 9 out of 12 DQ's across three 1 Mbit×4 DRAMs (actually three 4 Mbit DRAMs, each DRAM having four DQ's), and thereby supply the same amount of memory as would be found on a module employing nine 1 Mbit×1 DRAMs. Selection of the desired functional die or functional DQ's could be made at any level required (probe and/or final test) via fusible interconnects or other features allowing selection or deselection techniques.

3) The invention could also incorporate more than one die attached to a die mount. A module designed as memory could contain two or more regular production RAM die which have been singulated, more than one integrated die added to increase the memory density on the module, or a combination of singulated die and integrated die.

Using a number of regular production die is an advantage over using a specially designed integrated die in that it is not necessary for a company already manufacturing semiconductors to design a new die. Also, using a number of singulated die is an advantage over using a number of unsingulated die in that it is not necessary to test for adjacent functioning die on the wafer. Using singulated die, however, increases the number of components necessary to assemble the module and adds complexity to the alignment of the die in TAB.

When using multiple die, it is again possible to increase the number of functional units by using die with more than one DQ, for instance by using a ×4 DRAM. If one array fails at test, it would be possible to use another array on the die, thereby greatly reducing scrap. This would, of course, require replacement of the TAB film connecting the nonfunctional quadrant to the leads with a TAB film to connect the leads with the functional quadrant, but if the nonfunctional quadrants are found before the die are packaged they would not have to be scrapped. Methods of testing die before they are packaged are described in U.S. Pat. No. 4,899,107 which is incorporated herein by reference.

In fabricating the inventive module comprising multiple die and a support member having a groove thereon, the support member receives multiple wafer sections. The wafer sections are attached to the die mount in much the same way as a die is attached to a lead frame in a conventional manufacturing process of a logic device. Adhesive means or tape means are two such attachment methods. Note that the groove in the support member correctly aligns the die and maximizes the surface area of the mount to improve its effectiveness as a heat sink and is not necessary to ensure the functionality of the invention. It is also possible to attach a single wafer section to a die mount, and may be desireable under certain circumstances. For example, a manufacturer assembling two types of inventive modules, some with singulated die and some with unsingulated die or an integrated die, may want to use a die mount on all products to maintain a consistent form factor. Also, depending on the current used by a particular die, excessive heat could be generated by the die and therefore require a mount in order to dissipate the heat.

I/O pads are formed from a flex circuit or from metal layers laid down on top of the die during the die fabrication process. Said I/O leads are coupled with conductive means on the electronic device, thereby allowing the transfer of information between the die and the electronic device. The coupling means on a memory module should be such that the electronic device can address the memory module in byte data widths (×8, ×16, etc.), or in widths specified for the proper operation of the electronic device, with pinouts complying with JEDEC standards, or with specifications required by the electronic device. Inventive modules used for purposes other than memory would also comply with JEDEC standards, or with specifications required by the electronic device.

When a die mount is used with a die in which leads are formed from a flex circuit, the I/O pads on the tape are fixed to the edge of the die mount to allow an edge connector to couple with the electronic device. The I/O pads on the edge connector of the die mount are then connected to the electronic device. This connection can be made through a socket, by connecting leads to the die mount and soldering or socketing the leads, or by other workable means.

In the embodiment in which metal layers are laid down on top of the die as additional steps in the fabrication process, the I/O leads are formed by the terminating ends of the metal layers to form an edge connector to couple with the electronic device. The I/O pads on the edge connector of the die are then connected to the electronic device. This connection can be made through TAB, through a socket, by connecting leads to the die and soldering or socketing the leads, or by other workable means.

The flex circuits of TAB have come into increasing use over the past few years to provide an electrical pathway between two points. The polyimide which separates the internal traces is an insulator rated for very high temperatures and is quite inert and stable. These characteristics make it an excellent material in which to embed copper traces. The tape can encase a number of traces between flexible nonconductive layers of polyimide and can provide an electrical function similar to a PCB. The tape is designed and manufactured specifically for its intended application in a form specified by product designers, following much the same design-to-manufacturer path that a PCB would follow. Also similar to a PCB, the tape can be assembled in multiple layers to accommodate space restrictions.

TAB has an advantage over conventional wire bond techniques in that one multilayer polyimide tape design would enable all connections to be performed during one simultaneous process step. The module manufacturer would purchase the multilayer copper traces as a one-piece assembly, which could have a chip capacitor already installed, if necessary. TAB is also more reliable than traditional wire bond techniques due to its strength. Finally, the pads on a die could be "bumped" with a noble metal, thereby making the pads less susceptible to corrosion than conventional wire bonds and facilitating their coupling with contacts on the flex circuit. It is also possible to connect the contacts on the flex circuit using wirebonding or by using a conductive adhesive paste such as that available from Johnson Matthey of San Diego, Calif.

Instead of a flex circuit, the electrical pathway from the die bond pads to the I/O pads which attach to the electronic device can be fabricated from metal layers laid down an top of the die. The number of layers of metal, as with the number of layers in the flex circuit design, depends on the complexity of the module's function. Most PCBs, as used with SIMMs, are two or four layers, and the number of layers required for the invention should correspond.

After the I/O pads are formed, from either the flex circuit or metal mask layers on the surface of the die, the I/O pads must be connected by some means to the electronic device.

Leads can be attached to the I/O pads by means described later, or a flex circuit can be used to attach the I/O pads from the die to the electronic device, both of which are described later in this document.

It is known that typical room lighting can disturb a charge in a memory cell of a DRAM. Normally a DRAM is encapsulated in plastic or ceramic that prevents light from reaching the die thus protecting it from potentially damaging environmental moisture and contact with foreign objects. The invention can also be encapsulated, but encapsulation is not necessary. If, however, the die on the invention is not encapsulated, it may be necessary to coat the surface of the die to shield the cells and other circuitry. Nitride layers such as silicon nitride and silicon dioxide are routinely used in the semiconductor industry, and would protect the die from moisture and mobile ions. It is alternately possible to provide a layer of oxide over the nitride in order to provide optical protection and foreign body protection. Methods of applying scratch protection and light block include drop dispense and conformal coatings.

DETAILED DESCRIPTION OF THE PREFERRED EMBODIMENT

FIGS. 1–5 and 12 show embodiments of the invention incorporating a die 10 manufactured for use in a conventional package, but packaged as an element of the invention. These embodiments use a tape automated bonding (TAB) flex circuit to act as a functional equivalent of a printed circuit board (PCB) used with previous module designs. FIGS. 6–11 show embodiments of the invention incorporating a die 10 which has had additional conductive layers 16 fabricated on the surface of the die during the die manufacturing process. These additional layers 16 function as the PCB of previous module designs.

Note that in the figures below, the relative sizes of each of the elements may not be shown in their actual proportions. For example, the die pads 18 are very small as compared with the overall size of the die 10, but are shown as being quite large in order to provide sufficient detail within the figures. Similarly, the flex circuit 12 is actually somewhat thinner than the die 10, but is shown as being only slightly thinner in order to provide sufficient detail.

Figure 1:
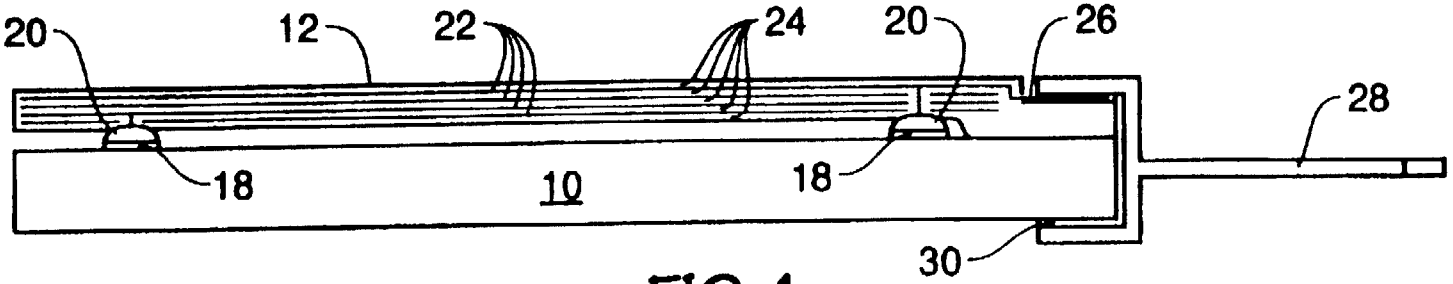
FIG. 1 shows a cross sectional side view of one embodiment of the invention incorporating a flex circuit which tapers into an input/output (I/O) pad. An optional lead is shown which can be attached to the I/O pad formed from the flex circuit. The lead would be soldered to vias on the electronic device in throughhole technology or plugged into a socket on the electronic device.

FIG. 1 shows one embodiment of the invention. The bond pads 18 on the surface of a die 10 are bumped with a conductive substance 20, usually a noble metal, to facilitate bonding with a flex circuit 12. The flex circuit 12 contains internal layers of a conductive material 22 such as copper separated with layers of a nonconductive material 24 such as polyimide. The traces 22 and nonconductive layers 24 therefore make up the flex circuit 12. The required number of internal layers of conductive material 22 of the flex circuit 12 is dependent on the complexity of the die 10. For a memory application, two or four layers should be sufficient, as a PCB for a memory SIMM generally comprises two or four layers, and the flex circuit 12 is the functional equivalent of the PCB of a SIMM. The flex circuit 12 of FIG. 1 shows four layers of traces 22.

The trace layers 22 of the flex circuit 12 form a single planar layer 26 on one end of the flex circuit 12 with each layer 22 remaining electrically isolated. The planar ends 26 of the trace layers 22 are exposed to allow connection with the electronic device (not shown) into which the inventive module will be installed. These exposed ends 26 therefore form the input/output (I/O) pads of the module. In one embodiment of the invention, the I/O pads 26 of the flex circuit 12 are connected directly to the electronic device by way of a socket or by TAB. FIG. 1, however, shows a SIP lead 28 attached to the I/O pads 26, the number of leads 28 corresponding to the number of exposed I/O pads 26 and determined by the requirements of the electronic device. If it is possible that shorting might occur on the edge of the die 10, the lead 28 must be electrically isolated from the die 10 with a layer of nonconductive material 30, such as polyimide. The leads 28 are electrically attached to the I/O pads 26 and therefore the die 10. This can be accomplished by bumping a solder or noble metal on the surface of the I/O pads 26, contacting the leads, and reflowing the solder in a hot air convection furnace, an infrared reflow furnace, with a laser, or by other workable means.

Figure 2:
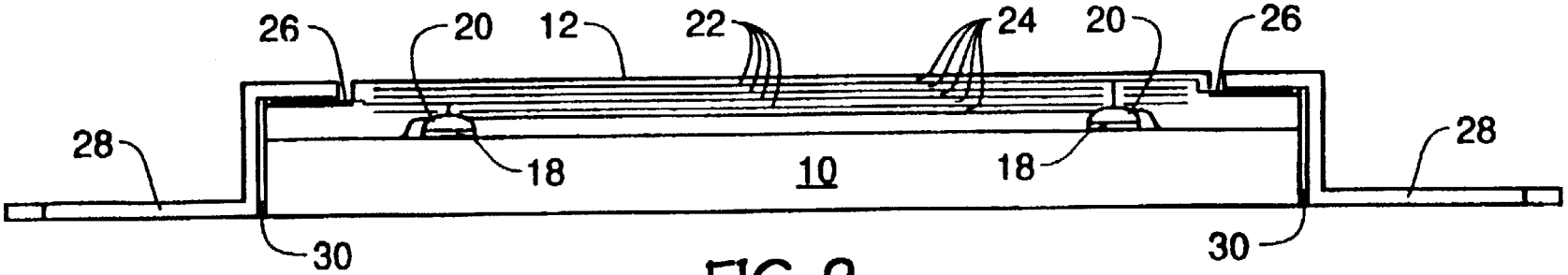
FIG. 2 shows a cross sectional side view of a second embodiment of the invention incorporating gull wing leads which would be soldered to solder pads on the electronic device in surface mount technology.

FIG. 2 shows an embodiment of the invention incorporating a gull wing package. The die pads !8 on a die 10 are bumped with a conductive material 20, usually a noble metal, to facilitate bonding with a flex circuit 12. The flex circuit 12 tapers on either side of the die 10, with the traces 22 within the flex circuit 12 forming an exposed planar layer 26 on either end. The exposed traces 26 thereby form the I/O pads 26. Leads 28 are attached to the I/O pads 26 in such a manner as to form a gull wing package. If shorting along the edge of the die 10 can occur from contact with the leads 28, provisions must be made to prevent such shorting by means such as an insulating layer 30 from a material such as polyimide. From FIG. 2, a method for manufacturing a package with leads 28 on all four sides can be easily determined by one of skill in the art.

Figure 3:
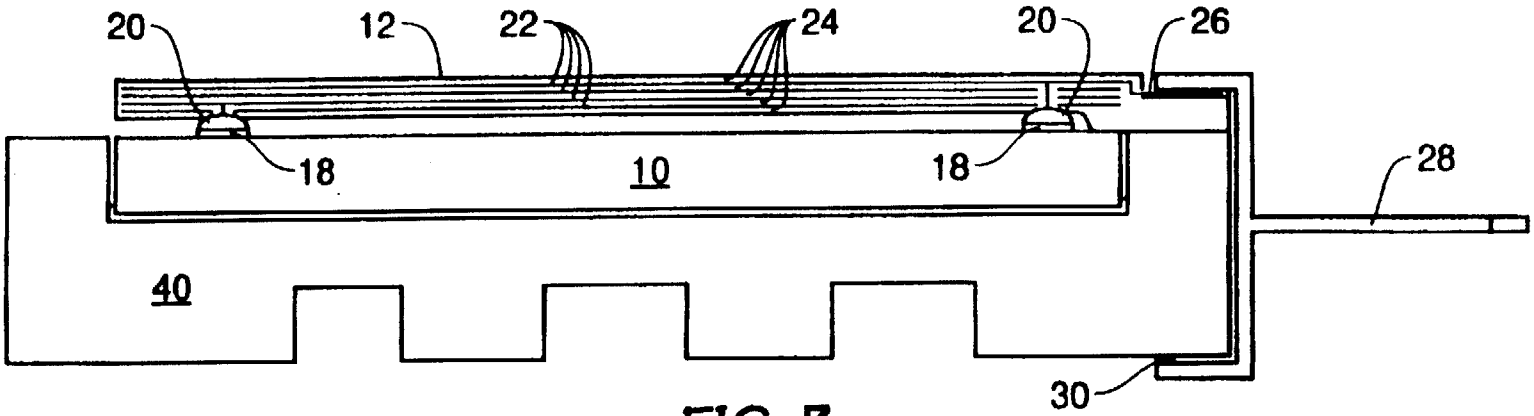
FIG. 3 shows an embodiment of the invention incorporating a die mount and a flex circuit which tapers to expose the traces of the flex tape, thereby providing means for coupling with an I/O lead.

FIG. 3 shows an embodiment of the invention comprising a die mount 40. The die mount 40 serves to provide support for the die 10, to act as a heat sink for the die 10, and to allow more than one die 10 to comprise the invention. One (or more) die 10 is received in a groove in the die mount 40 which allows for accurate alignment of the die 10. The die 10 is attached to the die mount 40 by means known in the art, such as by adhesive means or by tape means. Die pads 18 on the die 10 are bumped with a conductive material 20, usually a noble metal, to facilitate coupling with a flex circuit 12. The flex circuit 12 tapers at one end, and the traces 22 within the flex circuit 12 form a planer layer with each layer 22 electrically isolated. The traces 22 are exposed on one end 26 and thereby form I/O pads 26. The I/O pads 26 can be coupled directly with the electronic device (not shown), by means previously described, or leads 28 can be connected to the I/O pads 26. If leads 28 are not used, the inventive module can be received in a socket on the electronic device which couples the I/O pads 26 with the electronic device, or the I/O pads 26 can be coupled with pads on the electronic device by means such as a flex circuit. If leads 28 are used, the leads 28 can be received in a socket on the electronic device, or soldered to vias on the electronic device. If the die mount 40 is manufactured from a conductive material such as aluminum, an insulating layer 30 manufactured from a material such as polyimide must separate the conductive leads 28 from the conductive mount 40.

Figure 4:
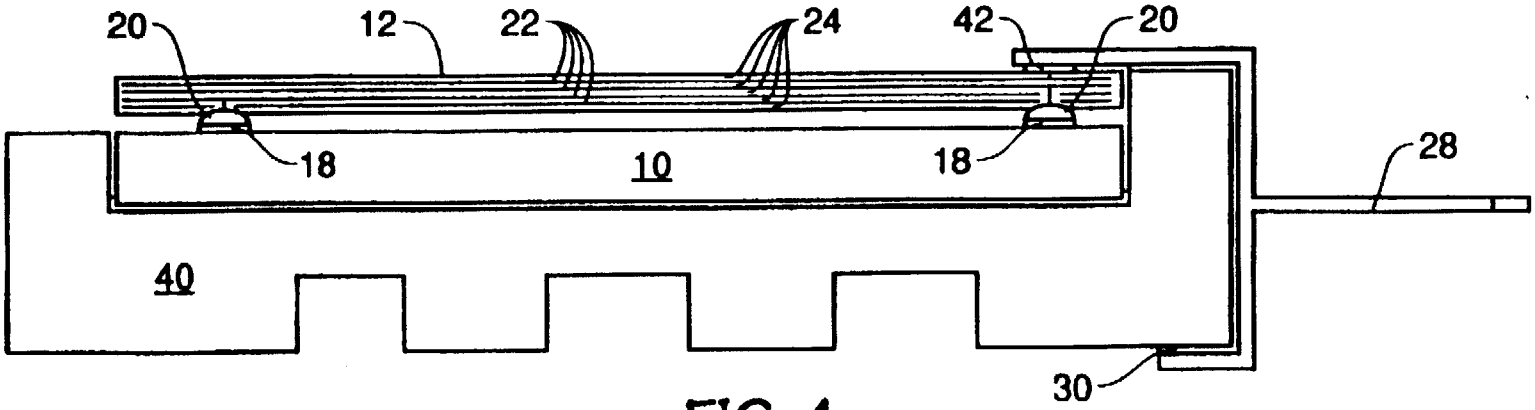
FIG. 4 shows an embodiment similar to that of FIG. 3 with a different means for connecting an I/O lead.

FIG. 4 shows an embodiment of the invention comprising a die mount 40 similar to that shown in FIG. 3, but with different means for attaching leads 28 to the flex circuit 12. The die 10 is received in a groove in the die mount 40 which allows for accurate alignment of the die 10. The die 10 is attached to the die mount 40 by means known in the art, such as by adhesive means or by tape means. Die pads 18 on the die 10 are bumped with a conductive material 20, usually a noble metal, to facilitate coupling with a flex circuit 12. Pads 42 on the flex circuit 12 are coupled with inner traces 22 and form I/O pads 42. The I/O pads 42 can be coupled directly with the electronic device, or leads 28 can be connected to the I/O pads 42 as shown. If leads 28 are not used, the inventive module can be received in a socket on the electronic device, or the I/O pads 42 can be coupled with pads on the electronic device by means such as a flex circuit. If leads 28 are used, the leads 28 can be received in a socket on the electronic device, or soldered to vias on the electronic device. If the die mount 40 is conductive, an insulating material 30 must separate the conductive leads 28 from the conductive mount 40.

Figure 5:
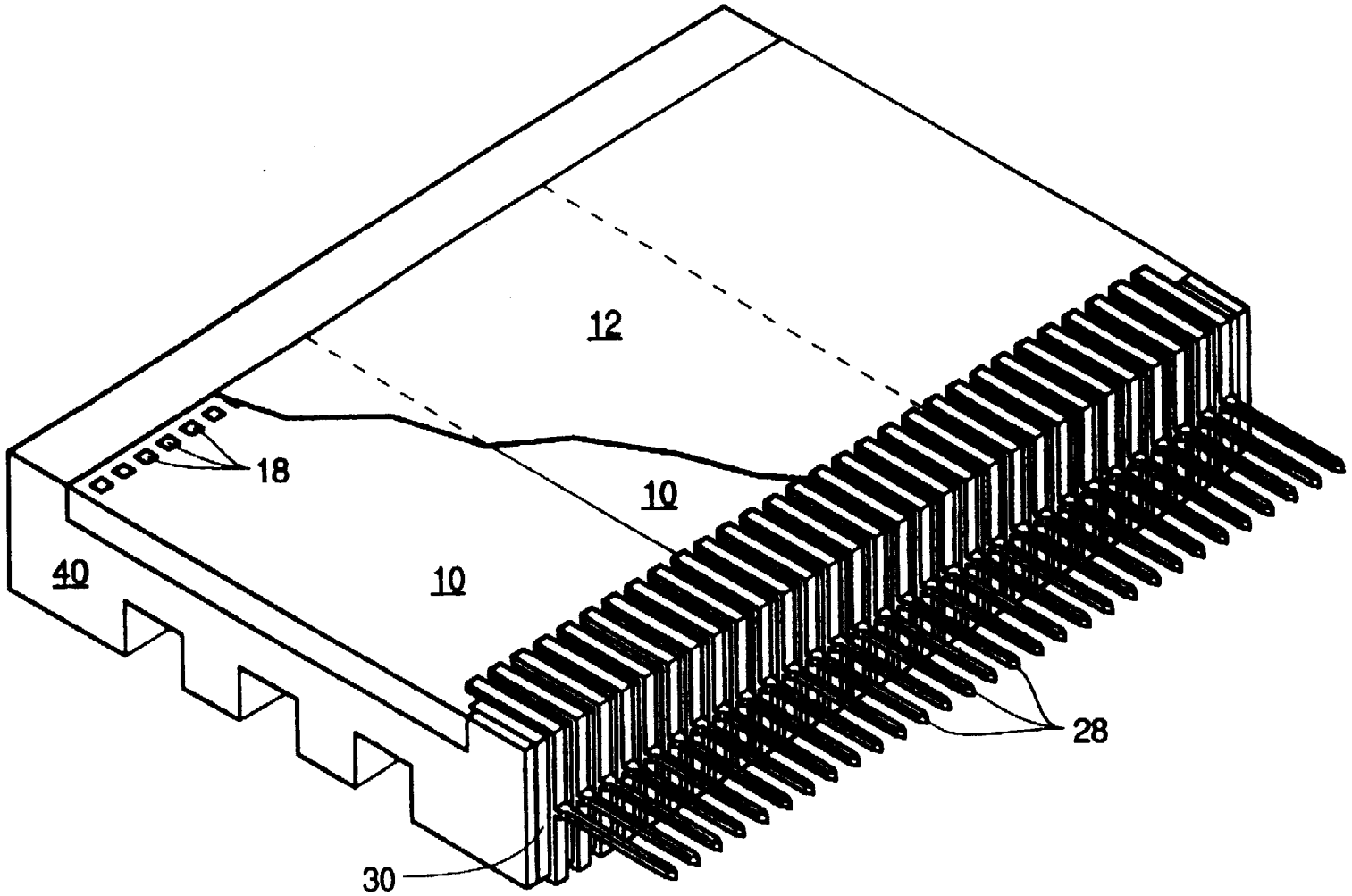
FIG. 5 shows an isometric view of the embodiment of FIG. 4.

FIG. 5 shows an isometric view of the embodiment of FIG. 4, with multiple die. The invention herein comprises: wafer sections (die) 10 with logic cells (not shown), supporting circuitry (not shown), and bond pads 18; a die mount 40 which supports the wafer sections 10; leads 28, with each lead electrically coupled to a bond pad 18 via a flex circuit 12, with the flex circuit 12 located on top of the die 10. (Note that the die pads 18, which are found on either end of the die 10, are covered on one end in FIG. 9 by the leads 28.) If the die mount 40 is made of a conductive material, it will be necessary to insulate the leads 28 from the die mount 40 with a layer of insulating material 30, such as polyimide. If the die mount 40 is made of a nonconductive material, this layer of insulating material 30 would not be necessary.

The die 10 of the invention will contain a number of bond pads 18 with each pad 18 electrically coupled to an I/O lead 28 attached to the die mount 40. While an 1 MB SIMM has approximately 558 solder/wire bond connections, a SIMM of the same memory density incorporating the invention would have about 30.

The inventive module design is much easier to assemble than previous designs due, in part, to its reduced number of components. Previous designs of memory modules, for example, require up to nine RAMs to be soldered to a PCB. The die are attached to a lead frame, and a wire is attached from each of the bond pads on the RAM to the leads on the lead frame. The die and lead frame are then encapsulated in a plastic or ceramic package. A PCB must be designed and manufactured, then a number of RAMs are soldered to it.

By contrast, on the disclosed invention the one (or more) die is attached to a die mount. Bond pads on the die are electrically coupled to the leads by means such as wire bonding or TAB. The one (or more) die is attached to a die mount. An embodiment of the invention incorporating an integrated die requires, for a 30 lead memory module, 60 interconnects instead of over 550 for a memory module manufactured with previous designs. There is no conventional plastic encapsulation required for the invention, and no PCB since the layout of the TAB replaces the traces which would normally be found on a PCB. In addition, the reduction in assembly steps reduces the assembly stress placed upon the memory module components, thereby increasing reliability.

Figure 6:
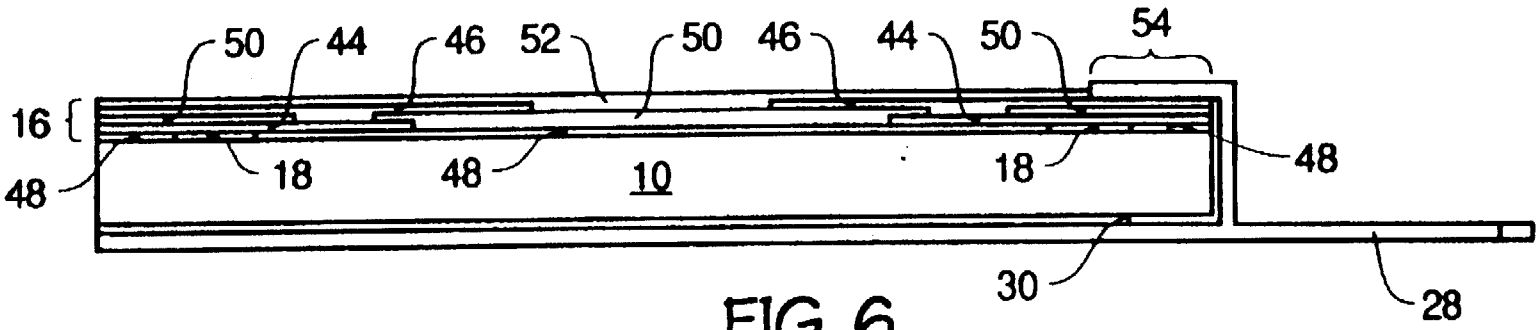
FIG. 6 shows an embodiment of the invention incorporating a die which uses layers of conductive material separated by layers of nonconductive material to function as a printed circuit board (PCB) of previous modules.

FIG. 6 shows an embodiment of the invention comprising a die 10 which has layers 16 of conductive and insulative layers added. The die 10 and bond pads 18 can use the same masks used by a die manufactured for use as a commodity semiconductor, or can be manufactured as a custom device. In either case, layers 16 of conductive and nonconductive material are laid down on top of the die 10 and bond pads 18; the number of layers depend on the design. For example, a die manufactured as memory might have two or four additional layers of conductive traces, as the PCB of a memory module usually has two or four layers of trace material, and the additional layers on the inventive module function essentially as a PCB. These additional layers 16, therefore, perform the function of the flex circuit of the embodiments having the flex circuit. In FIG. 6, two layers of conductive material 44, 46 sandwiched between three layers of insulating material 48, 50, 52 are shown. A first insulative interdielectric layer 48, a second insulative interdielectric layer 50, and a third insulative interdielectric layer 52 are formed from a material such as polyimide. A first conductive layer 44 and a second conductive layer 46 are manufactured from a material such as aluminum. The interdielectric layers 48, 50, 52 and conductive layers 44, 46 function as the PCB of a typical semiconductor module. The layout of the layers 16 depends on the functional requirements of each specific design. One end 54 of the conductive traces 44, 46 are exposed thereby forming an I/O pad 54. The I/O pad 54 can be coupled with a lead 28, which can be soldered to the electronic device or inserted into a socket on the electronic device, or the I/O pad 28 can be directly connected to the electronic device by TAB means or by other workable means.

FIG. 6 shows an inventive module manufactured with SIP leads 28. The leads 28 are electrically coupled with the I/O pads 54. This can be accomplished by bumping a solder or noble metal (not shown) on the surface of the I/O pads 54, contacting the leads 28, and reflowing the solder not shown in a hot air convection furnace, an infrared reflow furnace, with a laser, or by other workable means. If shorting of the die 10 by the leads 28 is possible, an insulative layer 30 of material must separate the conductive lead 28 from the die 10. The leads 28 are then inserted into a socket on the electronic device, or soldered to vias on the electronic device.

Figure 7:
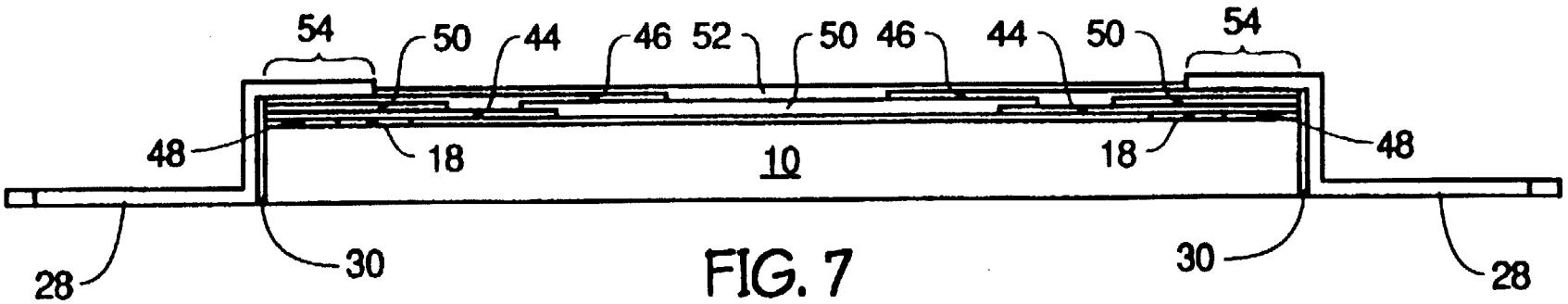
FIG. 7 shows an embodiment of the invention incorporating gull wing leads.

FIG. 7 shows an inventive module manufactured in a gull wing package. I/O pads 56 are coupled with leads 28 to form a gull wing package. If necessary, an insulative layer 30 separates the conductive leads 28 from the die 10 to prevent the die 10 from shorting.

Figure 8:
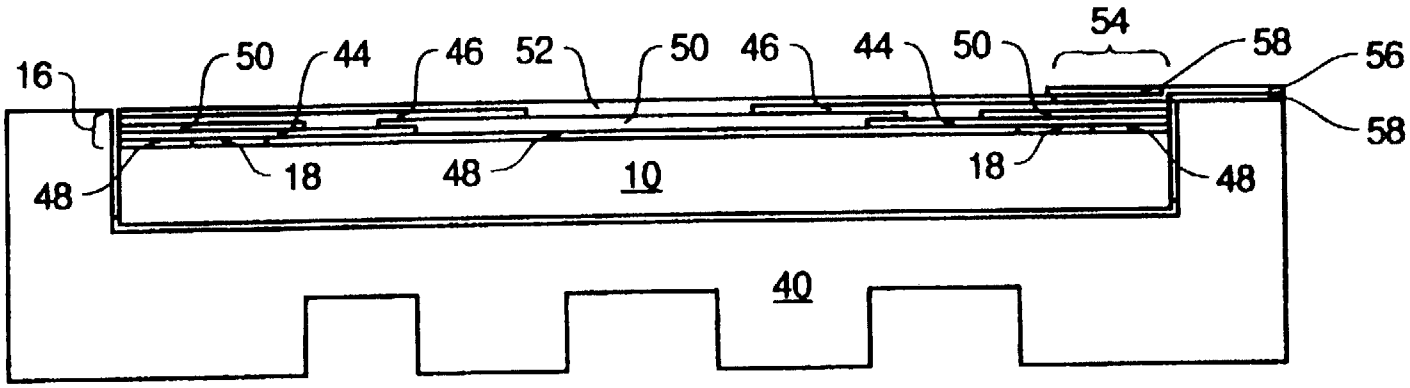
FIG. 8 shows an embodiment of the invention incorporating a die mount.

FIG. 8 shows a die 10 with interdielectric layers 48, 50, 52, and conductive layers 44, 46 attached to a die mount 40. The die mount 40 provides support for the die 10 and acts as a heat sink to remove heat from the die 10. The die 10 is attached to the die mount 40 by adhesive means, by tape means, or by other workable means. A conductive trace 56 extends the I/O pad 54 to the edge of the die mount 40, while an insulator 58 prevents the I/O pad 54 from shorting to a conductive die mount 40. The conductive trace 56 and the insulator 58 form a flex circuit. The electronic device is coupled with the conductive trace 56 by TAB means, by wirebonding means, or by insertion of the module in a socket on the electronic device.

Figure 9:
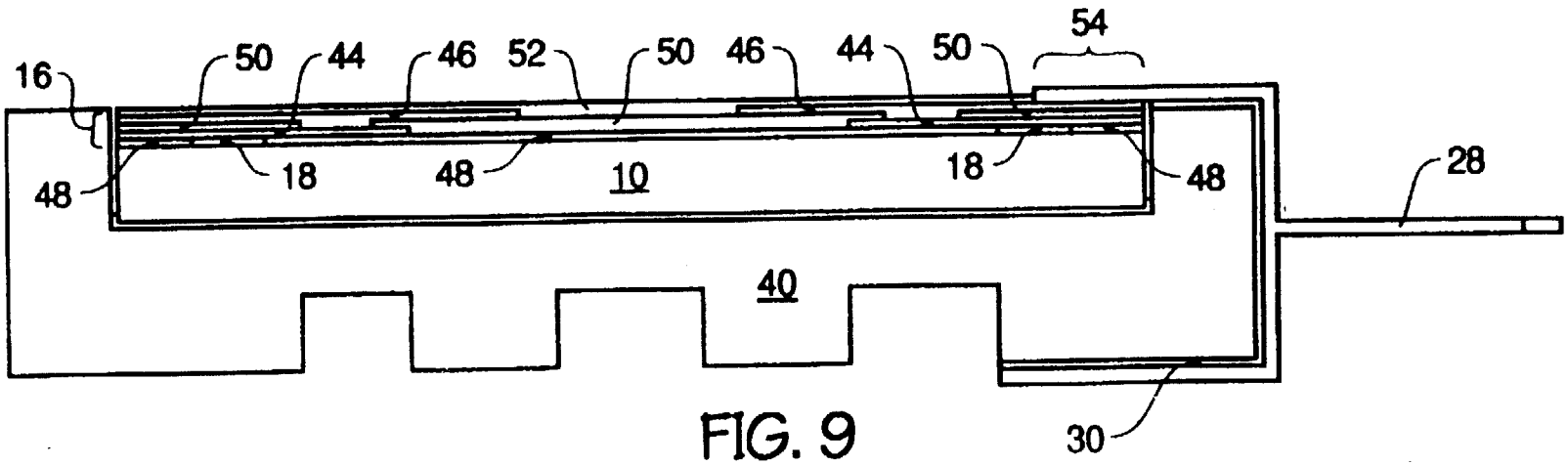
FIG. 9 shows an embodiment of the invention incorporating a die mount and a single in-line package (SIP) lead.

FIG. 9 shows the connection of the I/O pad 54 on the die 10 with a lead 28. The lead 28 is then coupled with the electronic device by insertion into a socket, or by soldering to a via. If the die mount 40 is fabricated from a conductive material, the leads 28 must be separated from the die mount 40 by an insulating layer of material 30 such as polyimide.

Figure 10:
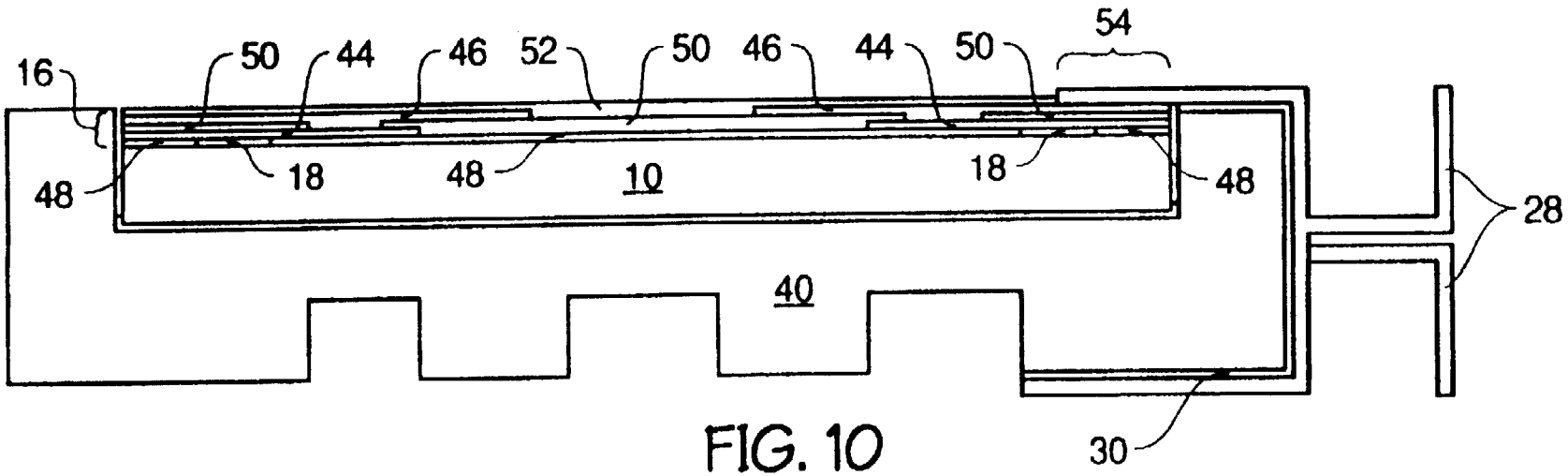
FIG. 10 shows an embodiment of the invention incorporating a die mount and surface mount zigzag in-line package (ZIP) leads.

FIG. 10 shows an embodiment similar to FIG. 9, but with surface mount style leads which mount the die in a direction which is perpendicular to the plane of the PCB onto which it is attached. This puts the die 10 in a position similar to that found on a ZIP through-hole package.

Figure 11:
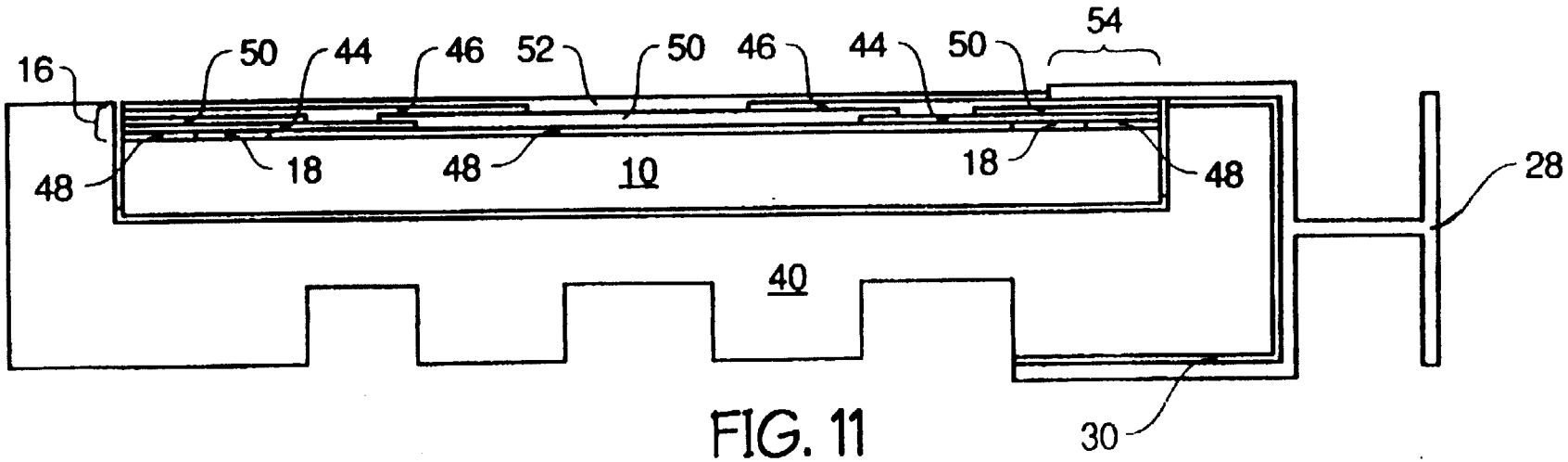
FIG. 11 shows an embodiment of the invention with modified SIP leads.

FIG. 11 shows an embodiment of the invention incorporating modified SIP leads.

Figure 12:
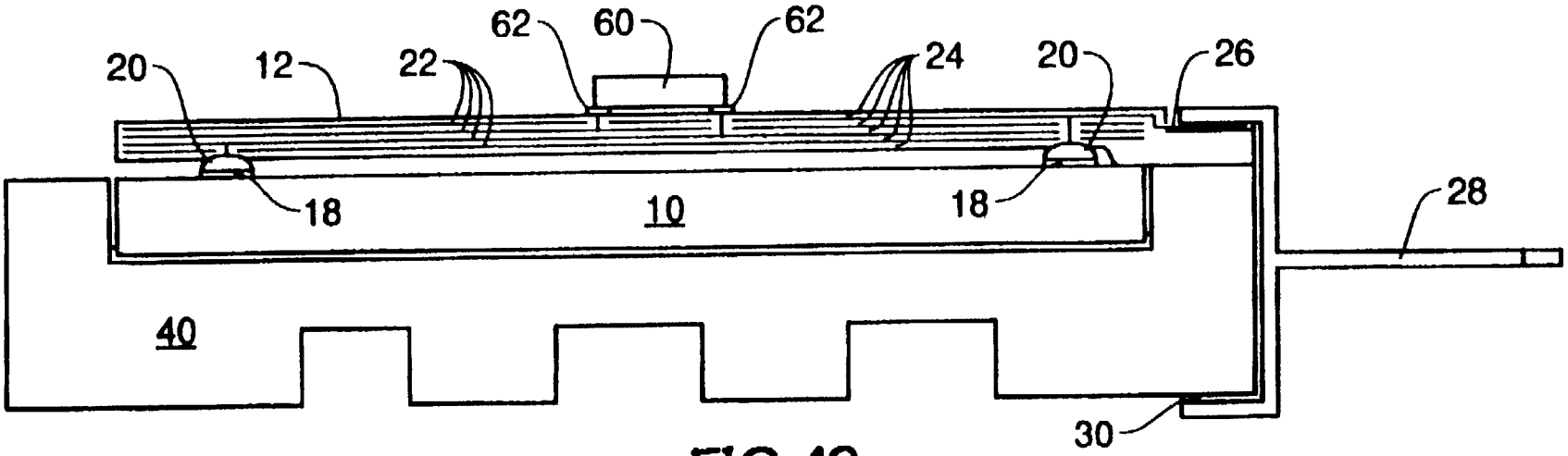
FIG. 12 shows a method of connecting decoupling capacitors to one embodiment of the invention.

FIG. 12 shows a cross sectional view of the inventive module incorporating a TAB flex circuit 12 and a decoupling capacitor 60 mounted to bonding surfaces 62 on the flex circuit. If the electrical characteristics of a particular inventive module are such that decoupling capacitors 60 are required to buffer the power coming into the module, provisions must be made for adding the capacitors 60. The capacitors 60 can be mounted after the flex circuit 12 is attached to the die 10, but would be most efficiently accomplished as a step during the manufacture of the flex circuit 12. The die 10 is attached to the die mount 40 via adhesive or other means known in the art. The die pads 18 are bumped with a conductive material 20, usually a noble metal, to facilitate bonding with the flex circuit 12. The flex circuit 12 can have several layers of internal traces 22 depending on the design, there being four shown in the flex circuit 12 of FIG. 12. Each trace 22 within the flex circuit 12 is bonded with the appropriate lead 28. If the die mount 40 is constructed of a conductive material, an insulating layer 30 is necessary to isolate each lead 28 from the die mount 40.

What has been described are specific configurations of the invention, as applied to particular types of modules. Clearly, additional variations can be made to the original design for adapting the invention to other modules and other package types. Therefore, the invention should be read as limited only by the appended claims.

We claim:

1. A memory module for receiving information from, and transferring information to, an electronic device in a plurality of parallel processes, the plurality of parallel processes being addressed as a byte of said information, comprising:

a. a wafer section having a substantially planar surface, die attach locations, plural memory arrays, and plural data out signals, with one data out signal corresponding to each memory array;

b. a plurality of conductive leads, said leads being self-supporting for connection of said wafer section to an external device without the benefit of supporting encapsulation material, said leads further being electrically coupled with said wafer section die attach locations thereby providing an electrical pathway allowing the transfer of said logic information between said wafer section and the electronic device, said pathway providing channels between said wafer section and the electronic device, said wafer section thereby addressable in byte data segments; and c. said plurality of conductive leads and said wafer section forming a module which has a substantially flat profile, which extends planarly in a direction generally defined by said planar surface of said wafer section.

2. The memory module of claim 1, further comprising an optically opaque layer superimposed over said wafer section.

3. The memory module of claim 1, wherein one of said data out signals has been deselected, and said corresponding memory array is inactive.

4. The memory module of claim 1, wherein said wafer section further comprises more than one unsingulated semiconductor die.

5. The memory module of claim 1, wherein said die attach locations are electrically coupled with said conductive leads by flex circuit means, wherein said flex circuit comprises plural internal conductive traces substantially encased in an insulative material.

6. The memory module of claim 5, wherein said traces are coupled with said die attach locations by solder means.

7. The memory module of claim 5, wherein said solder comprises gold.

8. The memory module of claim 1, wherein conductive and nonconductive layers are fabricated on the surface of said wafer section subsequent to the fabrication of said die attach locations, said die attach locations being electrically coupled with one or more of said conductive layers and said conductive leads are electrically coupled with one or more of said conductive layers.

9. The memory module of claim 1, wherein said wafer section is free from any substantially supporting encapsulation material.

10. The memory module of claim 1, wherein said wafer section is substantially encased in supporting encapsulation material.

11. The memory module of claim 1, further comprising a support member wherein said wafer section is received upon said support member.

12. The memory module of claim 11, further comprising more than one wafer section.

13. The memory module of claim 11, wherein the composition of said support member comprises aluminum.

* * * * *